United States Patent
Cho et al.

(10) Patent No.: US 7,556,989 B2
(45) Date of Patent: Jul. 7, 2009

(54) SEMICONDUCTOR DEVICE HAVING FUSE PATTERN AND METHODS OF FABRICATING THE SAME

(75) Inventors: Tai-Heui Cho, Gyeonggi-do (KR); Kun-Gu Lee, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 490 days.

(21) Appl. No.: 11/387,158

(22) Filed: Mar. 22, 2006

(65) Prior Publication Data

US 2006/0214260 A1    Sep. 28, 2006

(30) Foreign Application Priority Data

Mar. 22, 2005  (KR) .................. 10-2005-0023828
Dec. 7, 2005   (KR) .................. 10-2005-0118854

(51) Int. Cl.
  H01L 21/82   (2006.01)
  H01L 21/311  (2006.01)
(52) U.S. Cl. .................. 438/132; 438/694; 438/761; 257/529; 257/E23.149; 257/E21.592
(58) Field of Classification Search ............ 438/132, 438/694, 761; 257/529, E23.149, E21.592
  See application file for complete search history.

(56) References Cited

U.S. PATENT DOCUMENTS

| 7,422,956 B2 * | 9/2008 | Waite et al. ............ 438/406 |
| 7,422,972 B2 * | 9/2008 | Babcock et al. ......... 438/601 |
| 7,427,797 B2 * | 9/2008 | Ohguro et al. .......... 257/415 |

FOREIGN PATENT DOCUMENTS

| JP | 11-8307       | 1/1999 |
| KR | 2002-0008316  | 1/2002 |
| KR | 2002-0017311  | 3/2002 |

* cited by examiner

*Primary Examiner*—Ngan Ngo
(74) *Attorney, Agent, or Firm*—Marger Johnson & McCollom, P.C.

(57) ABSTRACT

A semiconductor device includes a semiconductor substrate having a fuse region and an interconnection region, a first insulating layer formed in the fuse region and the interconnection region, a fuse pattern formed on the first insulating layer in the fuse region, the fuse pattern including a first conductive pattern and a first capping pattern, an interconnection pattern formed on the first insulating layer in the interconnection region, including a second conductive pattern and a second capping pattern, and having a thickness greater than the thickness of the fuse pattern, and a second insulating layer formed on the first insulating layer and covering the fuse pattern.

13 Claims, 14 Drawing Sheets

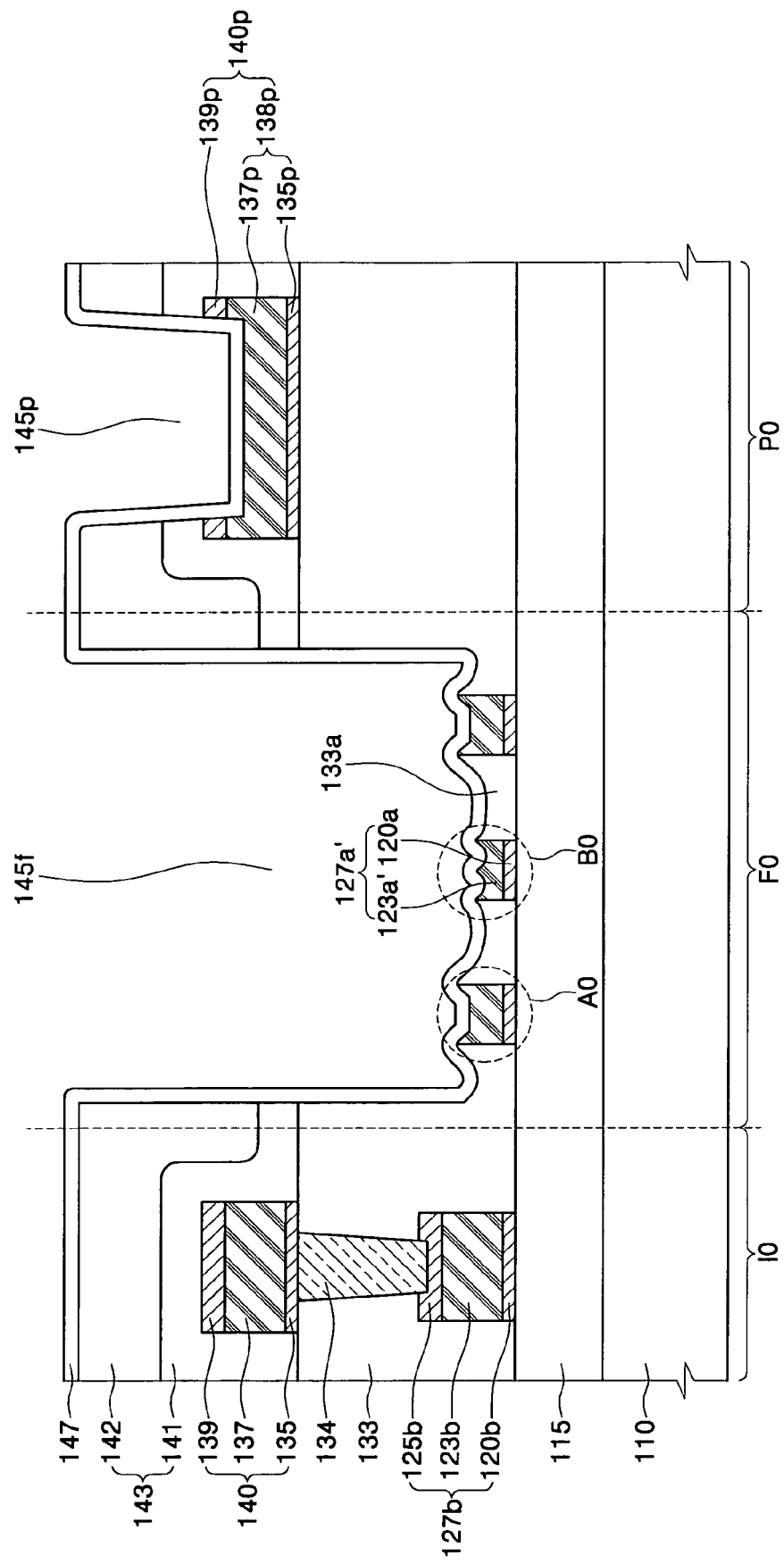

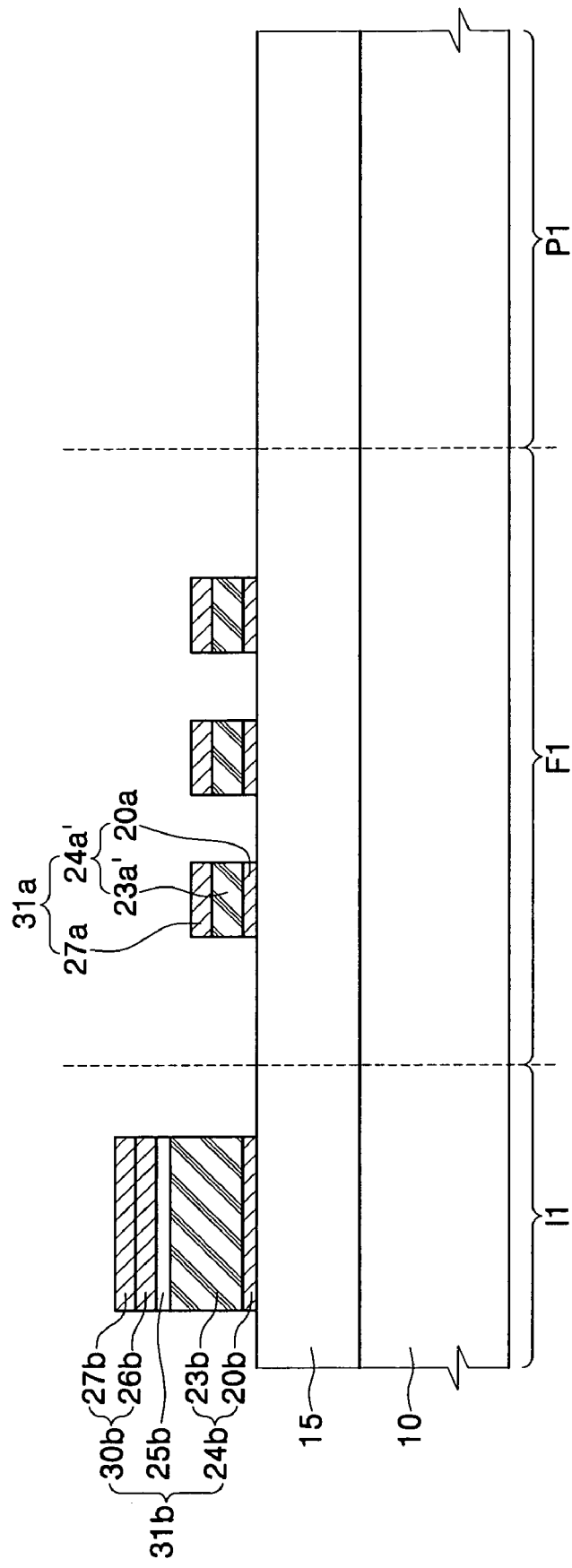

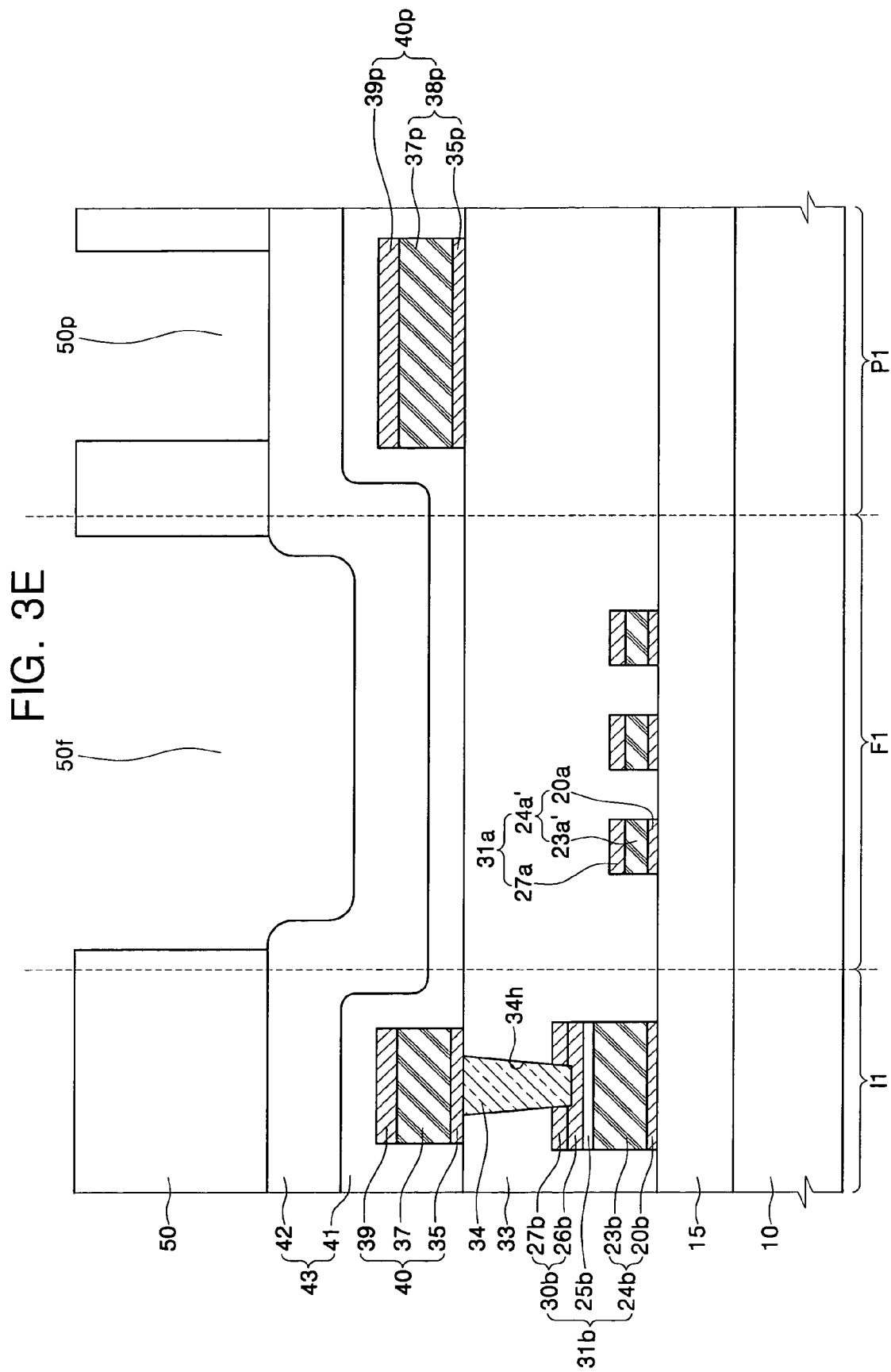

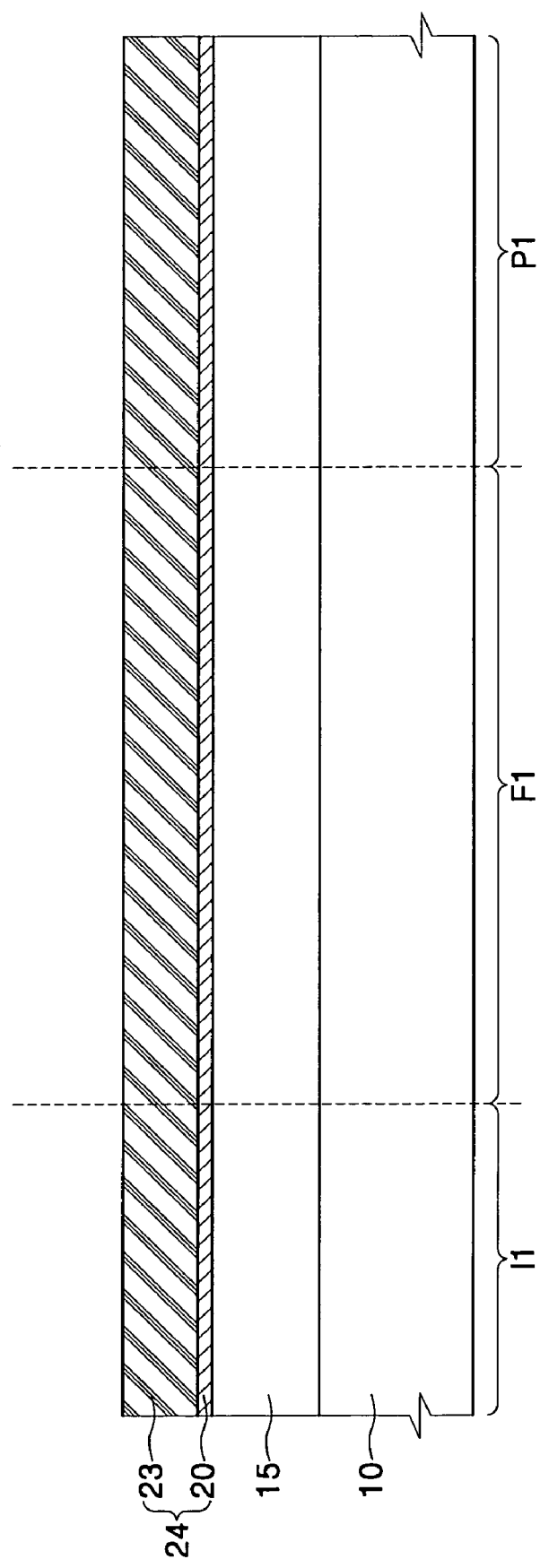

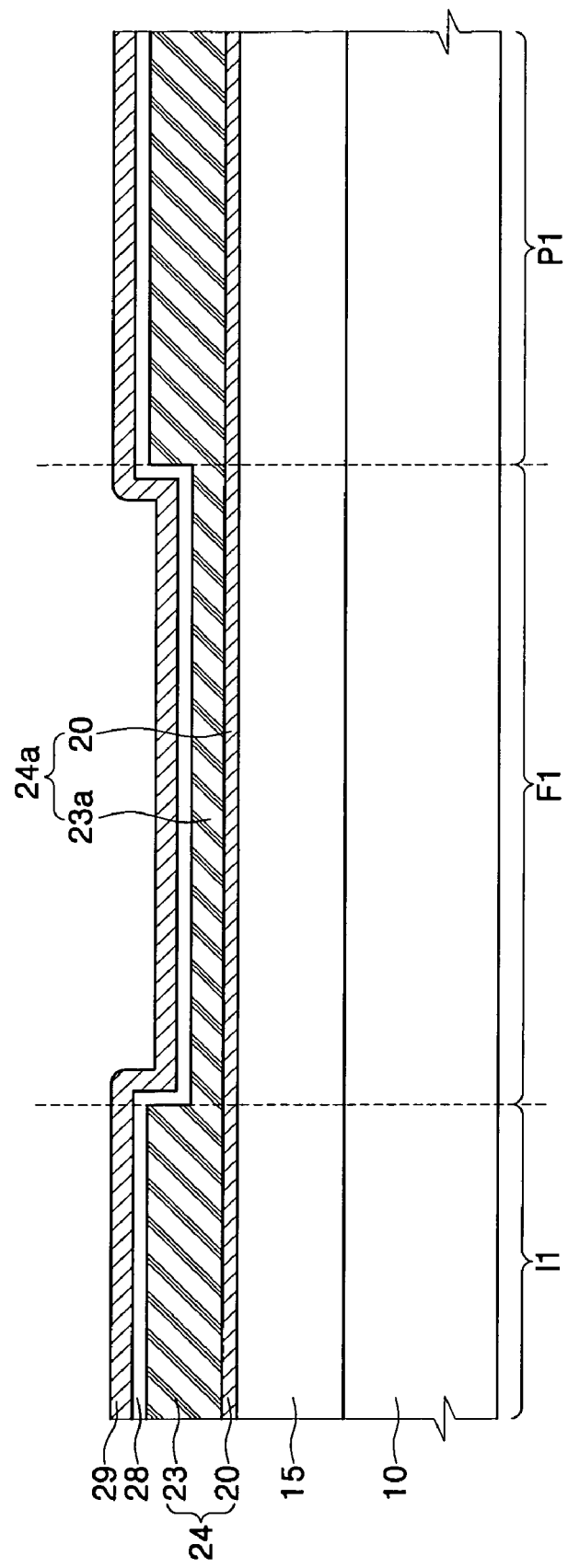

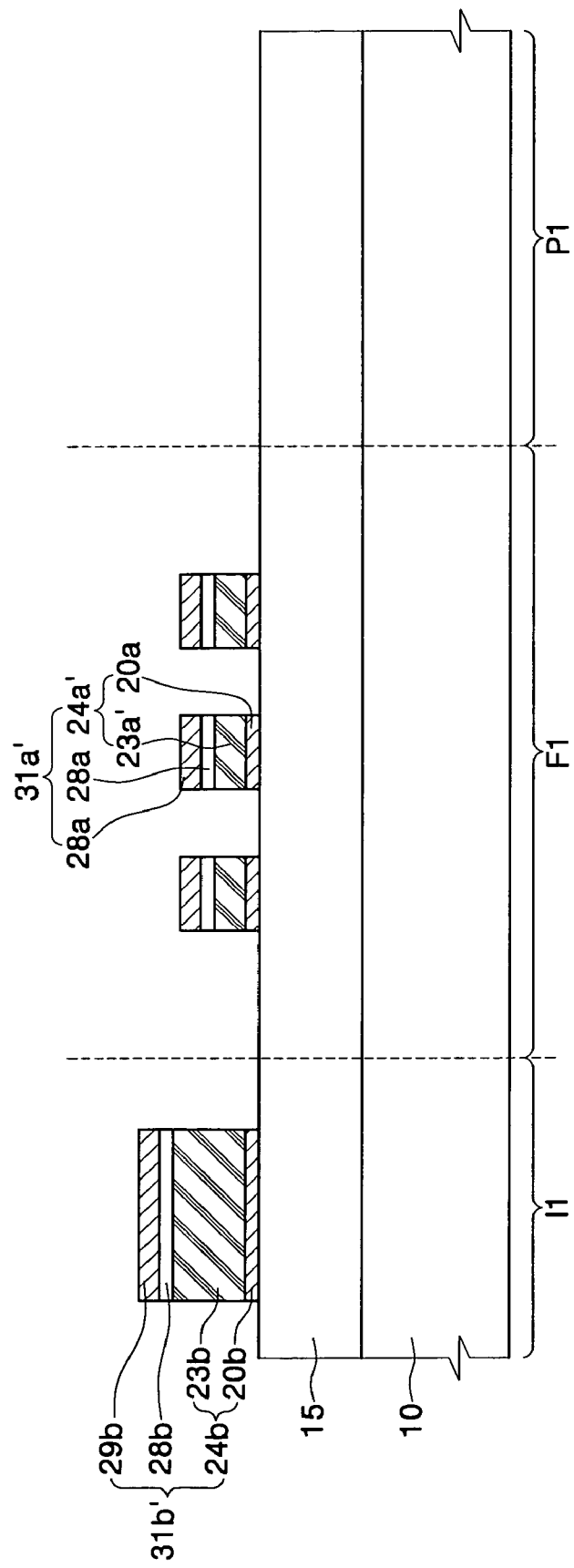

SEMICONDUCTOR DEVICE HAVING FUSE PATTERN AND METHODS OF FABRICATING THE SAME

CROSS-REFERENCE TO RELATED APPLICATION

This application claims priority from Korean Patent Application No. 10-2005-23828, which was filed on Mar. 22, 2005, and claims priority from Korean Patent Application No. 10-2005-118854, which was filed on Dec. 7, 2005. The disclosures of the Korean Patent Applications identified above are incorporated by reference in their entirety.

BACKGROUND OF INVENTION

1. Technical Field

This disclosure relates to a semiconductor device and a method of fabricating the same, and more particularly, to a semiconductor device having a fuse pattern and methods of fabricating the same.

2. Discussion of the Related Art

Semiconductor memory devices formed on a semiconductor substrate are electrically tested prior to an assembly process. As a result, semiconductor memory devices are classified as bad chips or good chips. When a chip includes at least one bad cell, the bad cell may be replaced with a redundant cell though a repair process. The repair process includes a laser beam irradiation operation blowing predetermined fuses such that the redundant cell has an address of the bad cell in a write mode and a read mode. The fuses are generally formed, concurrently with a bit line or an interconnection pattern within a semiconductor memory device.

Because of the current high-density integration and multi-layer structure of a semiconductor device, the thickness of an oxide layer to be etched to form a fuse window is larger than in the past. Thus, it is difficult to form a fuse and a bit line concurrently. Research has been conducted for a metal fuse to be formed at the same time of forming the interconnection pattern. To lower the resistance, the interconnection pattern is formed to be greater in thickness than the bit line. Thus, since the metal fuse patterned and formed with the interconnection pattern concurrently is also formed with a thickness greater than that of the bit line fuse, a high energy is required for blowing the metal fuse. After blowing the metal fuse, the residual matter of the metal fuse may cause a bridge with an adjacent metal fuse due to the thick thickness of the metal fuse. As a result, there remains a need for a thinner metal fuse to reduce the chance of a bridge forming with adjacent metal fuses and to reduce the energy required for blowing the fuse.

FIGS. 1A through 1D are cross-sectional views for explaining a method of fabricating a conventional semiconductor device. In FIGS. 1A through 1D, the portions indicated by reference numbers "I0", "F0" and "P0" represent an interconnection region, a fuse region and a pad region, respectively.

Referring to FIG. 1A, a first interlayer insulating layer 115 is formed on a semiconductor substrate 110. A barrier layer 120, a conductive layer 123 and a capping layer 125 are sequentially formed on the first interlayer insulating layer 115. The barrier layer 120 can be formed of a titanium nitride layer, or a titanium layer and a titanium nitride layer, which are sequentially stacked. The conductive layer 123 is formed of an aluminum layer. The capping layer 125 can be formed of a titanium layer, or a titanium layer and a titanium nitride layer, which are sequentially stacked.

Referring to FIG. 1B, preliminary fuse patterns 127a are formed of a barrier pattern 120a, a conductive pattern 123a, and a capping pattern 125a, which are sequentially stacked within the fuse region F0 by patterning the capping layer 125, the conductive layer 123 and the barrier layer 120 sequentially. Similarly, first interconnection patterns 127b include a barrier pattern 120b, a conductive pattern 123b, and a capping pattern 125b, which are sequentially stacked within the interconnection region I0.

A second interlayer insulating layer 133 is formed on the semiconductor substrate 110 having the preliminary fuse patterns 127a and the first interconnection patterns 127b. Via contact plugs 134 may be formed to penetrate the second interlayer insulating layer 133, and to be electrically connected with the first interconnection patterns 127b. An upper barrier layer, an upper conductive layer and an upper capping layer are sequentially formed on the substrate having the via contact plugs 134. Second interconnection patterns 140 are formed on the second interlayer insulating layer 133 within the interconnection region I0, by patterning the upper capping layer, the upper conductive layer and the upper barrier layer in turn, and concurrently, a pad 140p is formed on the second interlayer insulating layer 133 within the pad region P0.

Each of the second interconnection patterns 140 may be formed of an upper barrier pattern 135, an upper conductive pattern 137, and an upper capping pattern 139, which are sequentially stacked. The second interconnection patterns 140 are electrically connected with the first interconnection patterns 127b respectively, through the via contact plugs 134. The pad 140p includes a pad conductive pattern 138p and a pad capping pattern 139p, which are sequentially stacked, and the pad conductive pattern 138p is formed of a pad barrier pattern 135p and a pad conductive pattern 137p, which are sequentially stacked.

A passivation layer 143 is formed on the substrate having the second interconnection patterns 140 and the pad 140p. The passivation layer 143 may include a plasma oxide layer 141 and a plasma nitride layer 142, which are sequentially stacked.

Referring to FIG. 1C, a fuse window 145f exposing the capping patterns 125a is formed by etching the passivation layer 143 within the fuse region F0 and partially etching the second interlayer insulating layer 133 positioned below the passivation layer 143, by using a photolithograph process and an etch process. Then, fuse patterns 127a' which are thinner in thickness than the preliminary fuse patterns 127a are formed by etching and removing the exposed capping patterns 125a and partially etching the conductive patterns 123a positioned below the capping patterns 125a. Each of the fuse patterns 127a' is formed of the barrier pattern 120a and the partially etched conductive pattern 123a', which are sequentially stacked. Concurrently, a pad window 145p exposing the pad conductive pattern 138p is formed by sequentially etching predetermined portions of the passivation layer 143 and the pad capping pattern 139p within the pad region P0. At this time, the pad conductive pattern 137p may be partially etched.

A conformal fuse protecting layer 147 is formed on the substrate having the fuse patterns 127a'. As a result, the fuse protecting layer 147 is formed to cover the whole surfaces of the upper surface of the passivation layer 143, the inside of the fuse window 145f and the inside of the pad window 145p. The fuse protecting layer 147 may include a silicon nitride layer. The fuse protecting layer 147 is formed to protect the exposed fuse patterns 127a'.

Referring to FIG. 1D, the pad conductive pad 138p positioned below the pad window 145p is exposed by selectively patterning the fuse protecting layer 147. Then, a polyimide layer is formed on the substrate where the pad conductive pattern 138p is exposed, and a polyimide pattern 150 having a fuse window opening 150f and a pad window opening 150p to expose the fuse window 145f and the pad window 145p, respectively, is formed by an exposure process and a developing process. The semiconductor device is electrically tested prior to the assembly process, and as a result, with respect to bad cells, a laser beam is irradiated through the fuse window opening 150f and the fuse window 145f for the repair process. Then, in the assembly process, a pad bonding work is performed through the pad window opening 150p and the pad window 145p.

According to the above-described related art, the preliminary fuse patterns 127a may be unevenly etched while the second interlayer insulating layer 133 is etched. As a result, as shown in FIG. 1C, the upper surface of the fuse patterns 127a' may not be even by the non-uniform etching and may be uneven in thickness. Furthermore, the thickness of the fuse patterns 127a' may be different from each other in a wafer, because of the non-uniform etching of the preliminary fuse patterns 127a. For example, a fuse pattern A0 may be greater in thickness that a fuse pattern B0. As a result, when the same energy is used for blowing the fuse patterns, the fuse pattern B0 is blown. However, a residual pattern may exist with respect to the fuse pattern A0 because the fuse pattern A0 is greater in thickness than the fuse pattern B0.

Furthermore, as the fuse protecting layer 147 is formed after the fuse patterns 127a' are formed, a photoresist process is added to expose the pad conductive pattern 138p. The process of forming the polyimide pattern 150 is also separately performed. Consequently, since the processes with respect to the fuse window, the pad window and the polyimide pattern are separately performed, the photolithography process is performed three times, thereby increasing production costs.

Thus, there remains a need for a method of fabricating a semiconductor device having a fuse pattern, each pattern having a flat upper surface and improving a thickness uniformity of the fuse patterns in a wafer and simplifying the photolithography process.

SUMMARY

An embodiment includes a semiconductor device including a semiconductor substrate having a fuse region and an interconnection region, a first insulating layer formed in the fuse region and the interconnection region, a fuse pattern formed on the first insulating layer in the fuse region, the fuse pattern including a first conductive pattern and a first capping pattern, an interconnection pattern formed on the first insulating layer in the interconnection region, including a second conductive pattern and a second capping pattern, and having a thickness greater than the thickness of the fuse pattern, and a second insulating layer formed on the first insulating layer and covering the fuse pattern.

A further embodiment includes a semiconductor device including a semiconductor substrate having a fuse region and an interconnection region, a first insulating layer formed in the fuse region and the interconnection region, fuse patterns formed on the first insulating layer in the fuse region, each fuse pattern including a first conductive pattern and a first capping pattern, and the fuse patterns having substantially uniform thicknesses, an interconnection pattern formed on the first insulating layer in the interconnection region, including a second conductive pattern and a second capping pattern, and having a thickness greater than the thickness of the fuse patterns, and a second insulating layer formed on the first insulating layer and covering the fuse patterns.

A further embodiment includes a method of fabricating a semiconductor device including providing a semiconductor substrate having a fuse region and an interconnection region, forming a conductive layer on the semiconductor substrate, partially etching the conductive layer inside the fuse region to form a fuse conductive layer having a thickness thinner than a thickness of the conductive layer outside of the fuse region, and patterning the conductive layer and the fuse conductive layer to form a first conductive pattern inside the fuse region and a second conductive pattern inside the interconnection region.

BRIEF DESCRIPTION OF THE DRAWINGS

The above and other features and advantages will become more apparent to those of ordinary skill in the art by describing in detail preferred embodiments thereof with reference to the attached drawings in which:

FIGS. 1A through 1D are cross-sectional views illustrating a conventional method of fabricating a semiconductor device;

FIGS. 3A through 3F are cross-sectional views taken along a line I-I' of FIG. 2 illustrating a method of fabricating a semiconductor device according to an embodiment; and FIGS. 4A through 4C are cross-sectional views illustrating a method of fabricating a semiconductor device according to another embodiment.

DETAILED DESCRIPTION

Figure 1A:
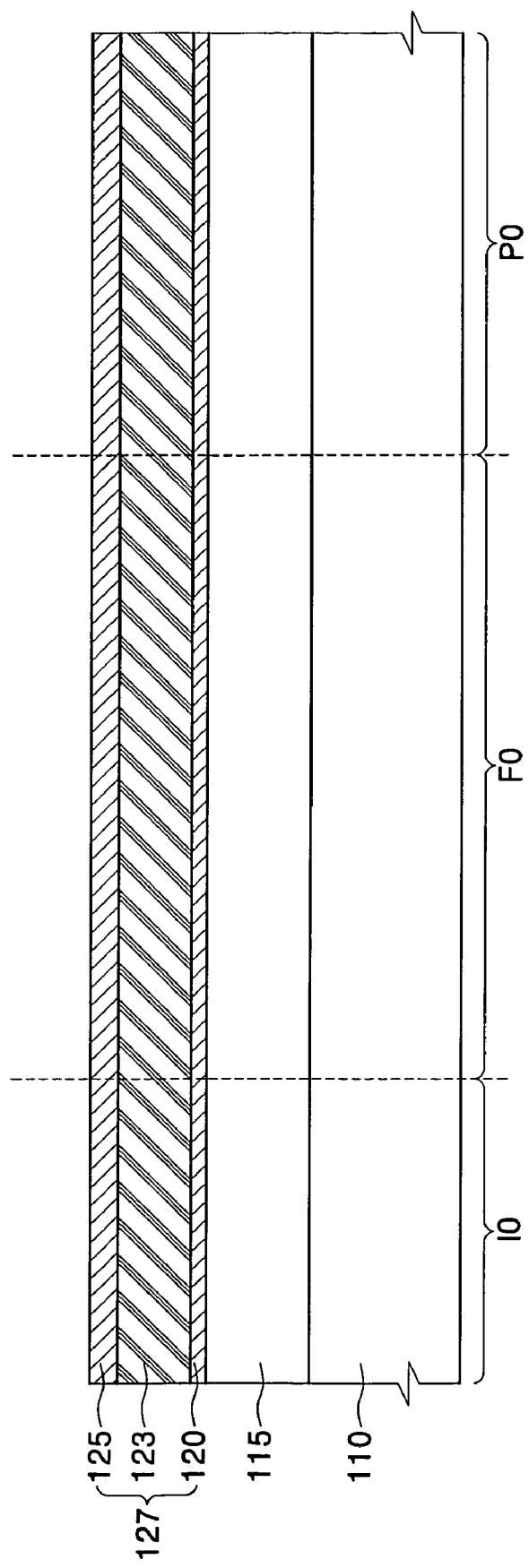
Figure 1B:
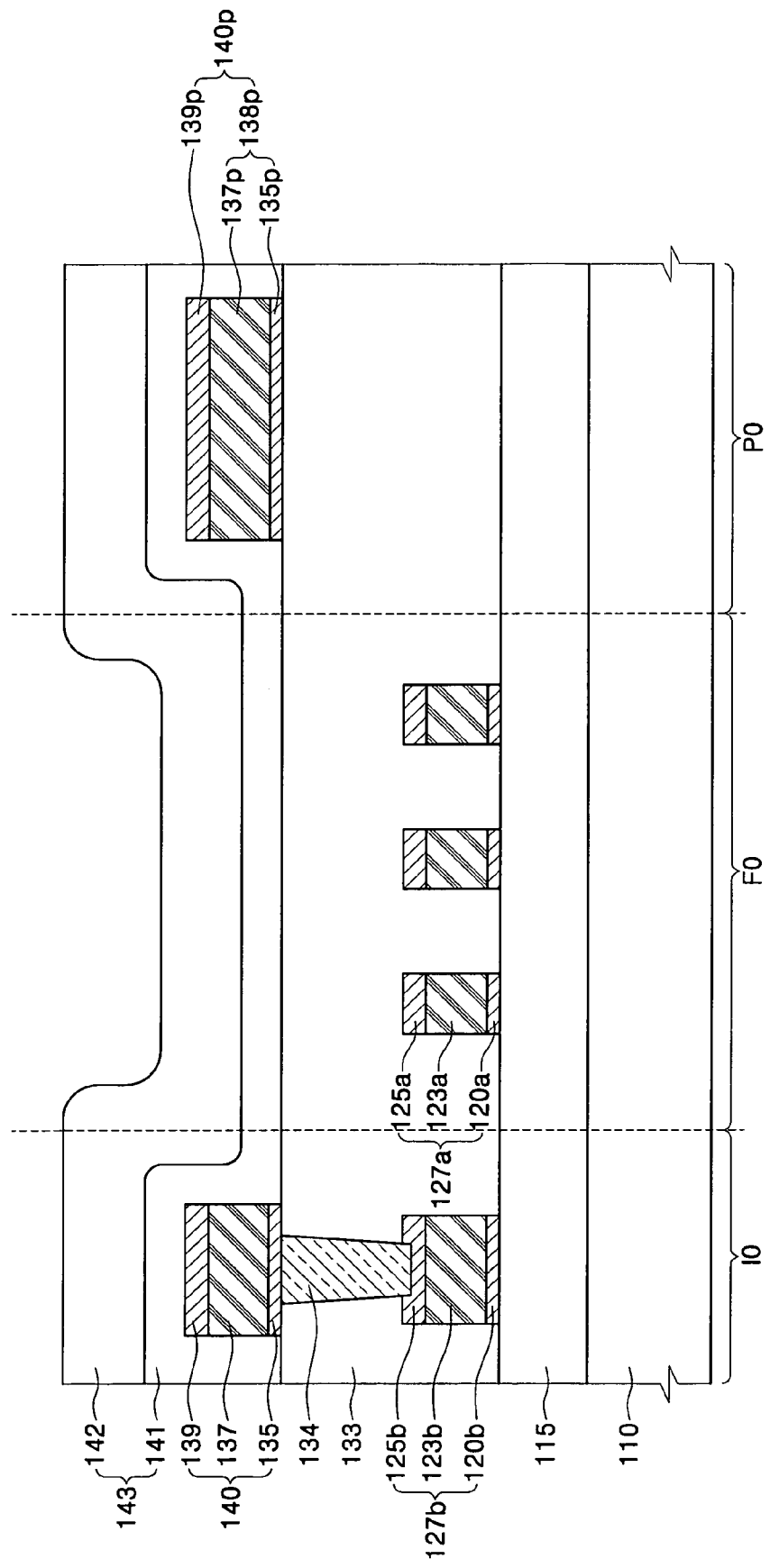
Figure 1D:
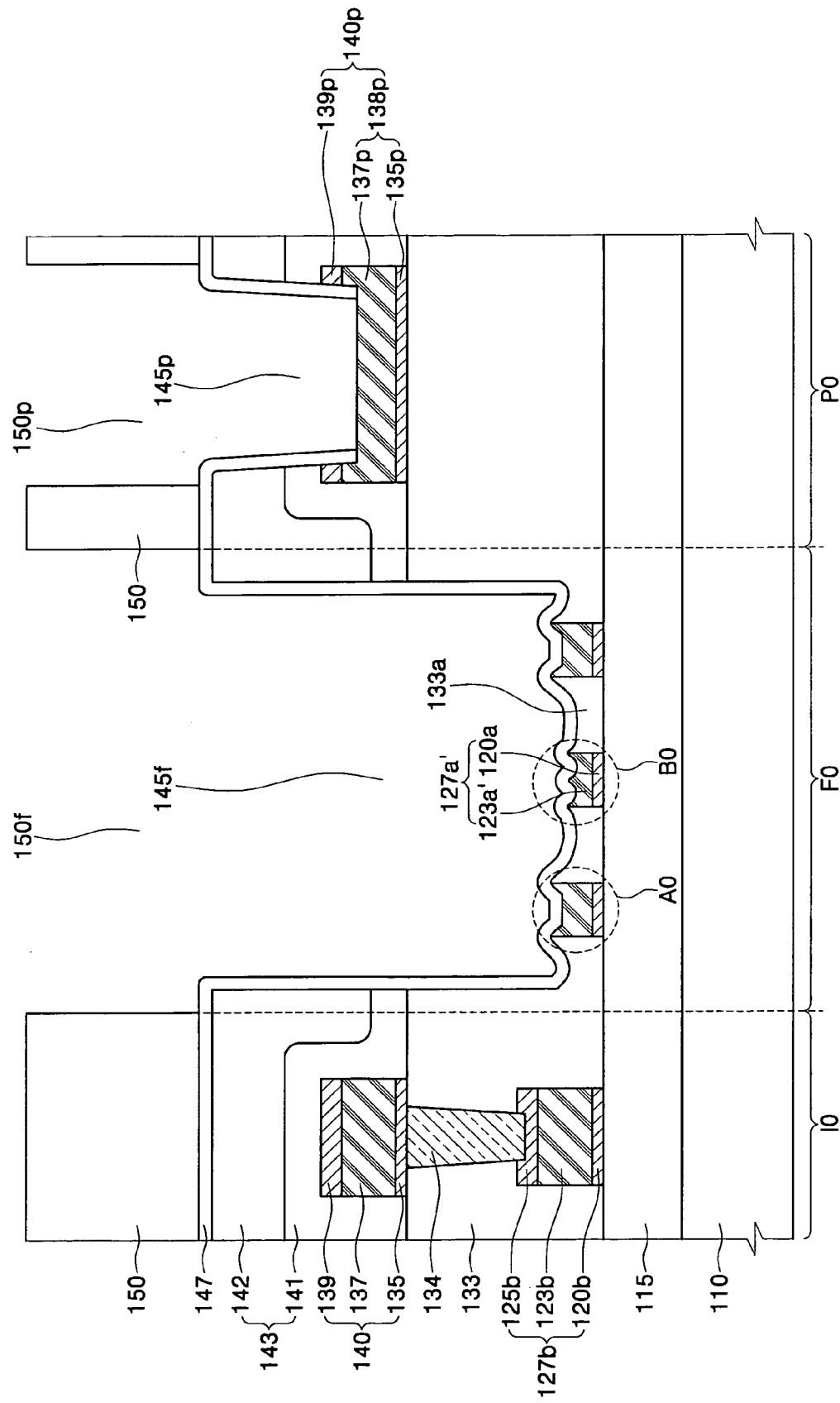

Embodiments will now be described more fully hereinafter with reference to the accompanying drawings. Embodiments may take many different forms and should not be construed as being limited to the embodiments set forth herein. Rather, these embodiments are provided so that this disclosure will be thorough and complete, and will fully convey the scope of the following claims to those skilled in the art. In the drawings, the thicknesses of layers and regions may be exaggerated for clarity. Like numbers refer to like elements throughout the specification.

Figure 2:
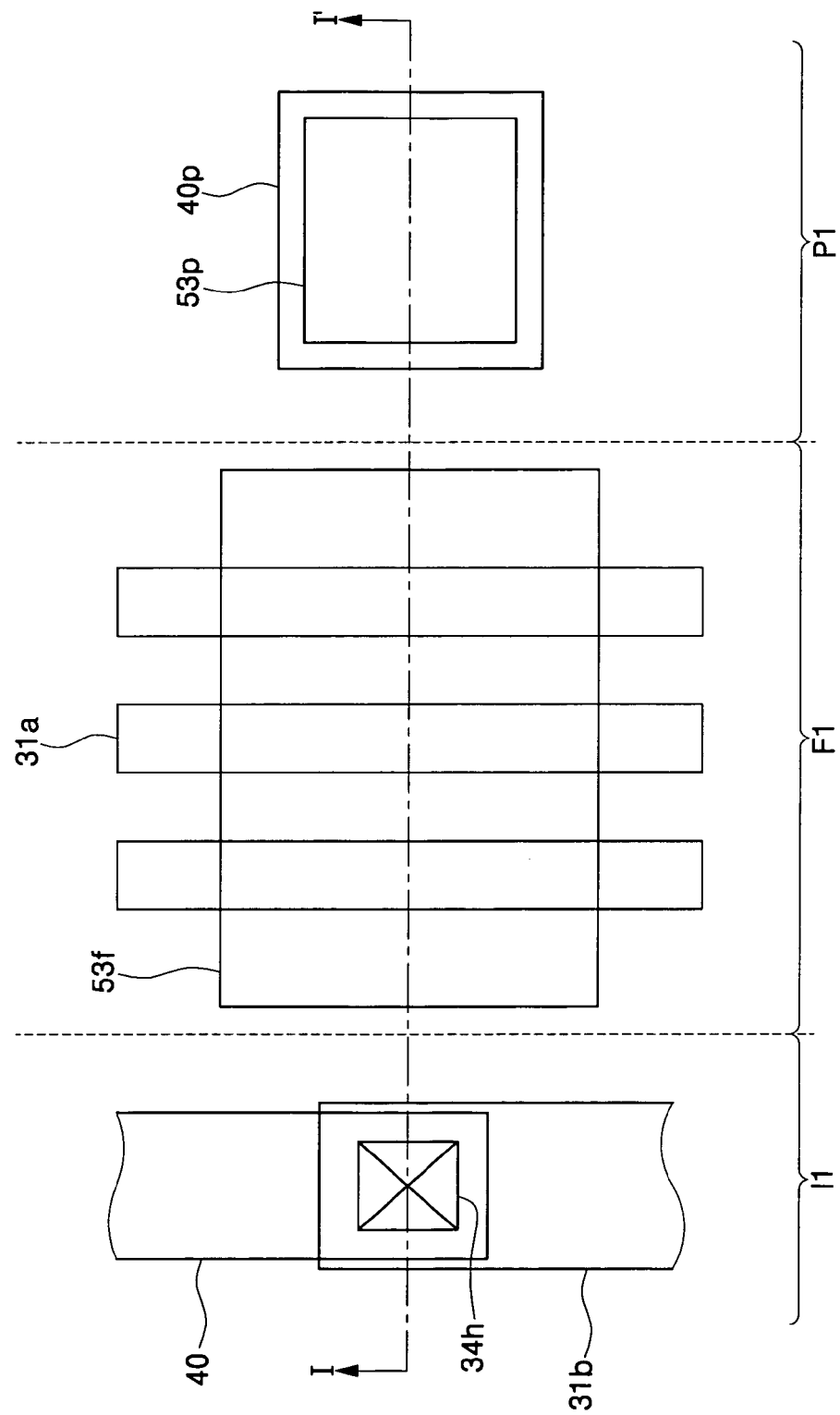
FIG. 2 is a plan view illustrating a semiconductor device according to an embodiment.

FIG. 2 is a plan view illustrating a semiconductor device according to an embodiment, and FIGS. 3A through 3F are cross-sectional views taken along line I-I' of FIG. 2 illustrating a method of fabricating a semiconductor device according to an embodiment. In FIGS. 2, and 3A through 3F, regions indicated by reference numbers "I1", "F1" and "P1" represent an interconnection region, a fuse region, and a pad region respectively.

Figure 3A:
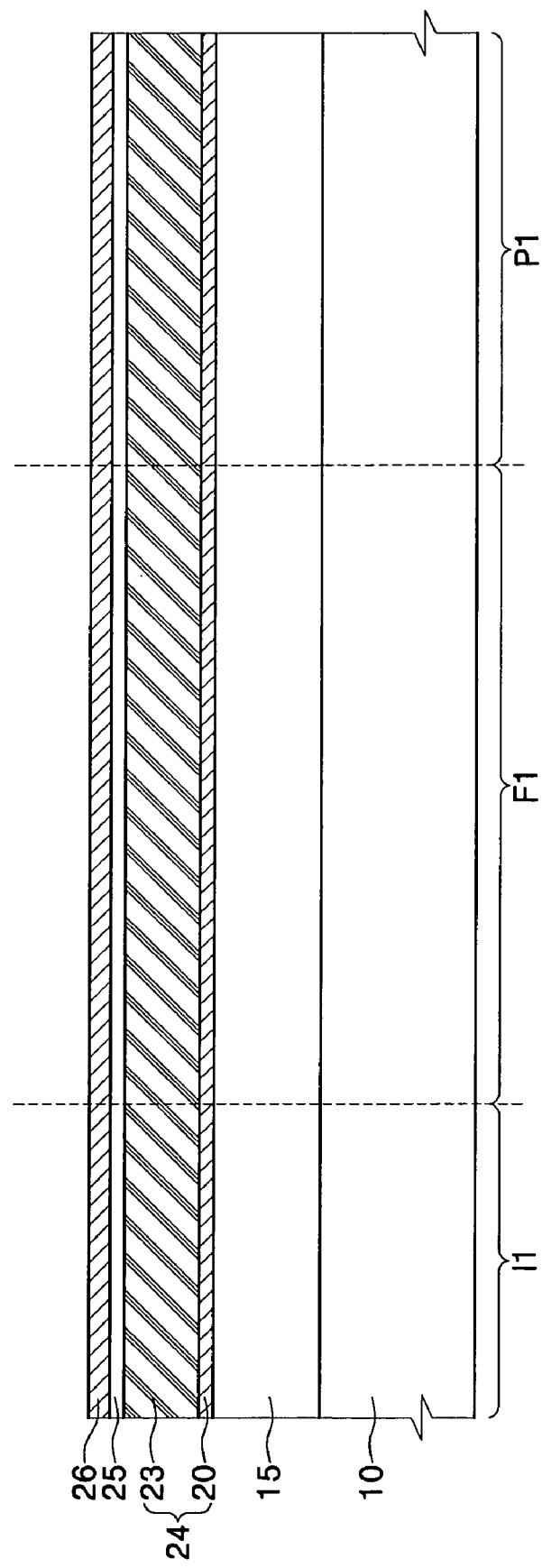

Referring to FIGS. 2 and 3A, a first interlayer insulating layer 15 is formed on a semiconductor substrate 10. Before the first interlayer insulating layer 15 is formed, various discrete elements, for example, transistors and resistors may be formed on the semiconductor substrate 10. A conductive layer 24 is formed on the first interlayer insulating layer 15. The conductive layer 24 may include a barrier layer 20 and a conductive layer 23, which are sequentially stacked. The barrier layer 20 may be omitted. The barrier layer 20 may include a titanium nitride layer, or may include a titanium layer and a titanium nitride layer, which are sequentially stacked. The conductive layer 23 may include one material layer selected from the group consisting of an aluminum layer, a tungsten layer, a copper layer, and combinations thereof.

A lower interface layer 25 and a lower capping layer 26 may be sequentially formed on the conductive layer 24. The lower interface layer 25 may include a titanium layer, and the lower capping layer 26 may include a titanium nitride layer. The lower capping layer 26 may be an anti-reflective layer.

Figure 3B:
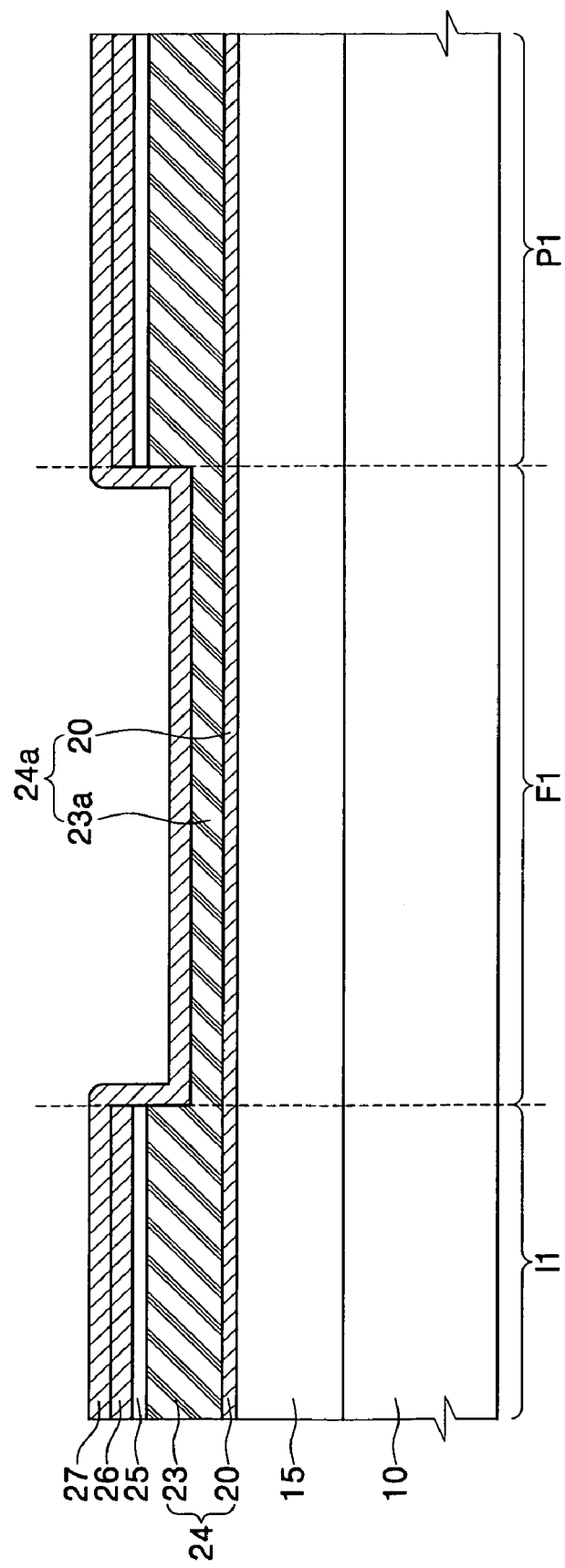

Referring to FIGS. 2 and 3B, a photoresist pattern (not shown) exposing the fuse region F1 is formed on the substrate 10 having the lower capping layer 26. The lower capping layer 26 and the lower interface layer 25 inside the fuse region F1 are sequentially etched and removed, using the photoresist pattern as an etch mask. Further, the conductive layer 24 is partially etched to form a fuse conductive layer 24a having a thickness thinner than that of the conductive layer 24. The fuse conductive layer 24a may include the barrier layer 20 and a partially-etched conductive layer 23a, which are sequentially stacked. When the fuse conductive layer 24a is partially etched using the photoresist pattern as an etch mask, it may have a substantially uniform thickness.

Then, the photoresist pattern is removed. An upper capping layer 27 may be formed on the substrate 10 having the fuse conductive layer 24a. The upper capping layer 27 may include the same material layer as that of the lower capping layer 26. The upper capping layer 27 may be used as an anti-reflective layer during a subsequent patterning process. A process of forming the upper capping layer 27 may be omitted.

Referring to FIGS. 2 and 3C, the upper capping layer 27 and the fuse conductive layer 24a inside the fuse region F1 are sequentially patterned, using a photolithography process and an etch process, thereby forming fuse patterns 31a. Each of the fuse patterns 31a may include a first conductive pattern 24a' and a first upper capping pattern 27a, which are sequentially stacked. The first conductive pattern 24a' may include a first barrier pattern 20a and a first conductive pattern 23a', which are sequentially stacked. The fuse pattern 31a may be formed with a thickness of about 3000 Å or less.

Concurrently, the upper capping layer 27, the lower capping layer 26, the interface layer 25, and the conductive layer 24 inside the interconnection region I1 are sequentially patterned, thereby forming first interconnection patterns 31b. Each of the first interconnection patterns 31b may include a second conductive pattern 24b, a lower interface pattern 25b, and a capping pattern 30b, which are sequentially stacked. The second conductive pattern 24b may include a second barrier pattern 20b and a second conductive pattern 23b, which are sequentially stacked. The capping pattern 30b may include a lower capping pattern 26b and a second upper capping pattern 27b, which are sequentially stacked. The thickness of the fuse pattern 31a is thinner than that of the first interconnection pattern 31b. Since the fuse patterns 31a are patterned using a photolithography process and an etch process, they can have flat upper surfaces.

Figure 3D:
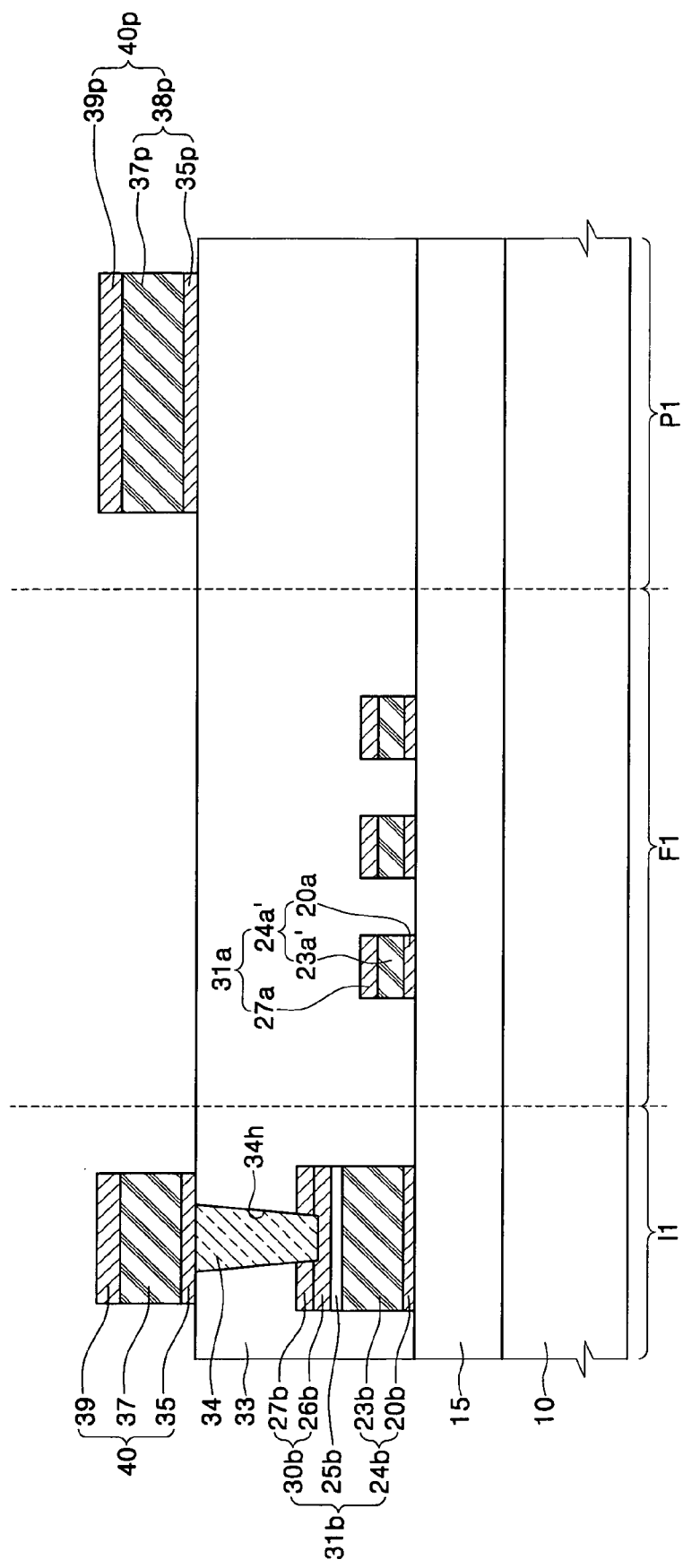

Referring to FIGS. 2 and 3D, a second interlayer insulating layer 33 is formed on the substrate 10 having the fuse patterns 31a and the first interconnection patterns 31b. The second interlayer insulating layer 33 may include a material layer selected from the group consisting of a tetra ethyl ortho silicate (TEOS) layer, a flowable oxide (FOX) layer, a plasma enhanced-TEOS (PE-TEOS) layer, a boron phosphorous silicate glass (BPSG) layer and combinations thereof. For example, the second interlayer insulating layer 33 may include a TEOS layer, a FOX layer, and a TEOS layer, which are sequentially stacked. Since a portion between the patterns 31a and 31b is filled with the FOX layer, the upper surface of the second interlayer insulating layer 33 may be planarized.

Via holes 34h may be formed to penetrate the second interlayer insulating layer 33 inside the interconnection region I1 and expose predetermined portions of the first interconnection patterns 31b. Then, via contact plugs 34 may be formed to fill the via holes 34h and be electrically connected to the first interconnection patterns 31b. Then, an upper barrier layer, an upper conductive layer, and an upper capping layer are sequentially formed on the substrate having the via contact plugs 34. The upper capping layer, the upper conductive layer, and the upper barrier layer are sequentially patterned, thereby forming second interconnection patterns 40 on the second interlayer insulating layer 33 inside the interconnection region I1, and concurrently, forming a pad 40p on the second interlayer insulating layer 33 inside the pad region P1.

Each of the second interconnection patterns 40 may include an upper barrier pattern 35, an upper conductive pattern 37, and an upper capping pattern 39, which are sequentially stacked. The second interconnection patterns 40 may be electrically connected to the first interconnection patterns 31b through the via contact plugs 34. The pad 40p may include a pad conductive pattern 38p and a pad capping pattern 39p, which are sequentially stacked, and the pad conductive pattern 38p may include a pad barrier pattern 35p and a pad conductive pattern 37p, which are sequentially stacked.

Referring to FIGS. 2 and 3E, a passivation layer 43 is formed on the substrate having the second interconnection patterns 40 and the pad 40p. The passivation layer 43 may include a plasma oxide layer 41 and a plasma nitride layer 42, which are sequentially stacked. Then, after a polyimide layer is formed on the substrate having the passivation layer 43, an exposure process and a developing process are performed, thereby forming a polyimide pattern 50 having a fuse window opening 50f and a pad window opening 50p exposing a predetermined portion of the fuse region F1 and a predetermined portion of the pad region P1, respectively.

Figure 3F:
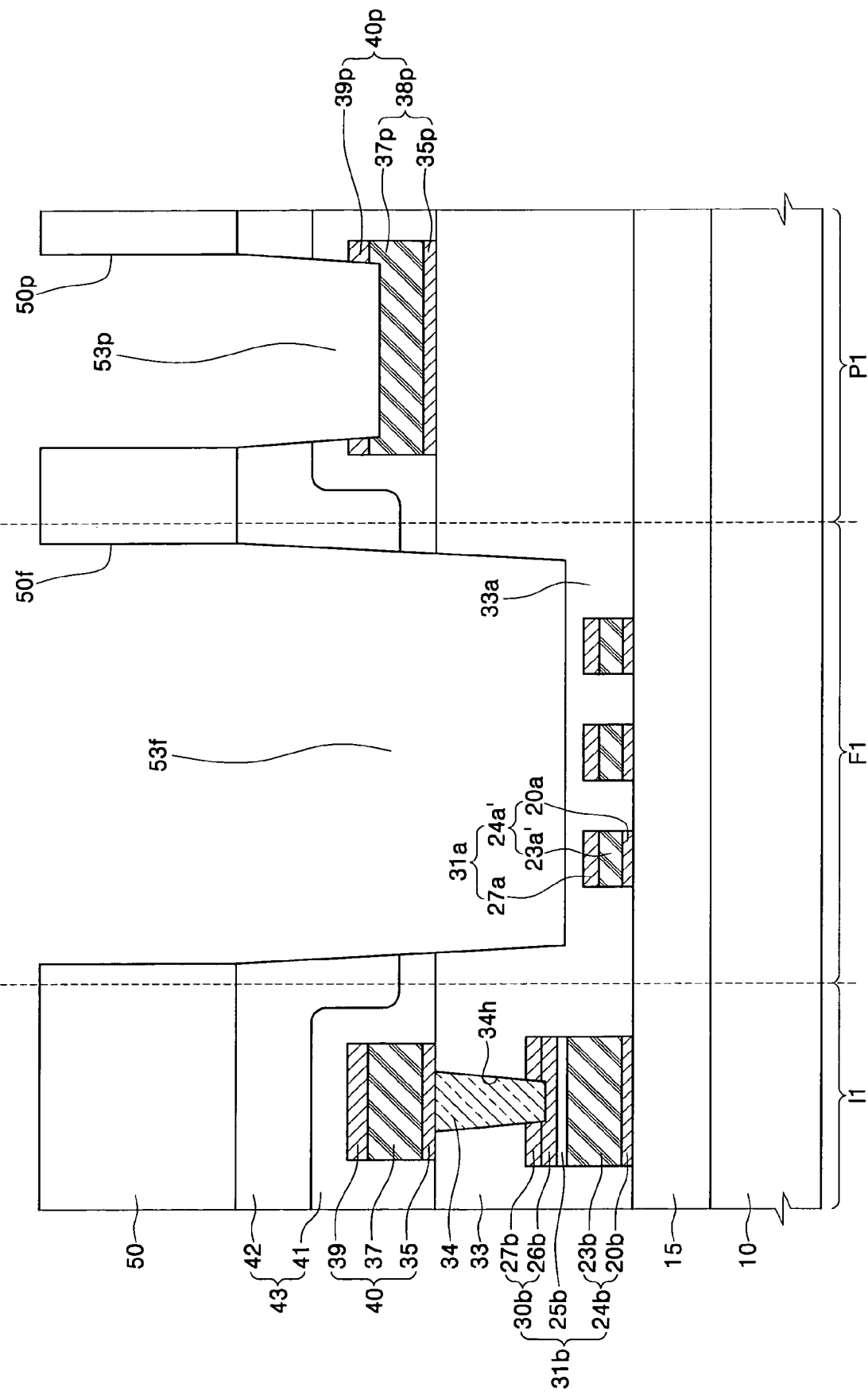

Referring to FIGS. 2 and 3F, the passivation layer 43 inside the fuse region F1 is etched through the fuse window opening 50f, using the polyimide pattern 50 as an etch mask, and the second interlayer insulating layer 33 below the passivation layer 43 is partially etched with a predetermined thickness remaining on the fuse patterns 31a, thereby forming a fuse window 53f. As a result, a second interlayer insulating layer 33a inside the fuse region F1 is formed with a thin thickness. Since the thin second interlayer insulating layer 33a covering the fuse patterns 31a includes an oxide layer such as a TEOS layer, a FOX layer, or a BPSG layer, a lower energy is required to blow the fuse patterns 31a as compared to the energy required in the conventional case of a silicon nitride layer used as a fuse protecting layer. Concurrently, a predetermined portion of the passivation layer 43 and a predetermined portion of the pad capping pattern 39p inside the pad region P1 are etched through the pad window opening 50p, thereby forming a pad window 53p exposing the pad conductive pattern 38p.

In some embodiments, the passivation layer 43 is selectively etched through the fuse window opening 50f and the pad window opening 50p during the formation of the fuse window 53f and the pad window 53p, so as to expose the second interlayer insulating layer 33 of the fuse region F1 and the pad capping pattern 39p of the pad region P1. Then, the exposed pad capping pattern 39p is etched so as to expose a pad conductive pattern 38p of the pad region I1, and then, the exposed second interlayer insulating layer 33 of the fuse region F1 may be partially etched.

The semiconductor device is electrically tested before an assembly process, and a repair process is performed by irradiating a laser beam through the fuse window opening 50f and the fuse window 53f. Then, a pad bonding operation is performed through the pad window opening 50p and the pad window 53pp in the assembly process.

As described above, each of the fuse patterns 31a has a thickness thinner than that of the first interconnection pattern 31b. Since the fuse patterns 31a are formed by patterning during the photolithography process and the etch process, each of the fuse patterns 31a can have a flat upper surface. Furthermore, as explained in reference to FIG. 3B, since the fuse conductive layer 24a is formed with a thin thickness by a partial etching in advance using the photoresist pattern as an etch mask, the uniformity of thickness of the fuse patterns 31a within a single wafer can be improved. Therefore, an error rate in a fuse blowing operation can be reduced.

Furthermore, since the fuse window 53f and the pad window 53p are formed using the polyimide pattern 50 as a mask, the number of the photolithography processes, which is three in the related art, can be reduced to one according to an embodiment. Therefore, when considering the photolithography process added in the operation of partially etching the conductive layer 24 in FIG. 3B, the number of the photolithography processes can be shortened to one as compared to the conventional method.

FIGS. 4A through 4C are cross-sectional views illustrating a method of fabricating a semiconductor device according to another embodiment. In FIGS. 4A through 4C, regions indicated by reference numbers "I1", "F1" and "P1" represent an interconnection region, a fuse region, and a pad region, respectively.

Referring to FIG. 4A, a first interlayer insulating layer 15 is formed on the semiconductor substrate 10. Before the first interlayer insulating layer 15 is formed, various discrete elements, for example, transistors and resistors may be formed on the semiconductor substrate 10. A conductive layer 24 is formed on the first interlayer insulating layer 15. The conductive layer 24 may include a barrier layer 20 and a conductive layer 23, which are sequentially stacked. The barrier layer 20 may be omitted. The barrier layer 20 may include a titanium nitride layer, or may include a titanium layer and a titanium nitride layer, which are sequentially stacked. The conductive layer 23 may include a material layer selected from the group consisting of an aluminum layer, a tungsten layer, and a copper layer and combinations of thereof.

Referring to FIG. 4B, a photoresist pattern exposing the fuse region F1 is formed on the substrate having the conductive layer 24. The conductive layer 24 is partially etched, using the photoresist pattern as an etch mask, thereby forming a fuse conductive layer 24a having a thickness thinner than that of the conductive layer 24. The fuse conductive layer 24a may include the barrier layer 20 and a partially-etched conductive layer 23a, which are sequentially stacked. When the fuse conductive layer 24a is partially etched, using the photoresist pattern as an etch mask, it may have a uniform thickness.

Then, the photoresist pattern is removed. An upper interface layer 28 and an upper capping layer 29 may be sequentially formed on the substrate having the fuse conductive layer 24a. The upper interface layer 28 may include a titanium layer, and the upper capping layer 29 may include a titanium nitride layer. The upper capping layer 29 may be used as an anti-reflective layer during a subsequent patterning process.

Referring to FIG. 4C, the upper capping layer 29, the upper interface layer 28, and the fuse conductive layer 24a inside the fuse region F1 are sequentially patterned using a photolithography process and an etch process, thereby forming fuse patterns 31a'. Each of the fuse patterns 31a' may include a first conductive pattern 24a', a first upper interface pattern 28a, and a first upper capping pattern 29a, which are sequentially stacked. The first conductive pattern 24a' may include a first barrier pattern 20a and a first conductive pattern 23a', which are sequentially stacked. The fuse pattern 31a' may be formed with a thickness of about 3000 Å or less.

Concurrently, the upper capping layer 29, the upper interface layer 28, and the conductive layer 24 inside the interconnection region I1 are sequentially patterned, thereby forming first interconnection patterns 31b'. Each of the first interconnection patterns 31b' may include a second conductive pattern 24b, a second upper interface pattern 28b, and a second upper capping pattern 29b, which are sequentially stacked. The second conductive pattern 24b may include a second barrier pattern 20b and a second conductive pattern 23b, which are sequentially stacked.

The thickness of the fuse pattern 31a' is thinner than that of the first interconnection pattern 31b'. Since the fuse patterns 31a' are patterned using a photolithography process and an etch process, they can have flat upper surfaces. Furthermore, as explained in reference to FIG. 4B, since the fuse conductive layer 24a is formed with a thin thickness by a partial etching in advance, using the photoresist pattern as an etch mask, a thickness uniformity of the fuse patterns 31a' within a single wafer can be improved. Therefore, an error rate in a fuse blowing operation can be reduced.

Then, the same processes as those as explained in reference to FIGS. 3D through 3F are performed, thereby forming a fuse window and a pad window.

A semiconductor device according to an embodiment will be explained referring to FIGS. 2 and 3F again. In FIGS. 2 and 3F, regions indicated by reference numbers "I1", "F1" and "P1" represent an interconnection region, a fuse region, and a pad region, respectively.

Referring to FIGS. 2 and 3F, a first interlayer insulating layer 15 is disposed on a semiconductor substrate 10. Various discrete elements, for example, transistors and resistors may be disposed between the semiconductor substrate 10 and the first interlayer insulating layer 15. Fuse patterns 31a' are disposed on the first interlayer insulating layer 15 inside the fuse region F1. Each of the fuse patterns 31a' may include a first conductive pattern 24a', and a first upper capping pattern 27a, which are sequentially stacked. The first conductive pattern 24a' may include a first barrier pattern 20a and a first conductive pattern 23a', which are sequentially stacked. The first upper capping pattern 27a may be omitted. The fuse pattern 31a' may be formed with a thickness of about 3000 Å or less.

First interconnection patterns 31b are disposed on the first interlayer insulating layer 15 inside the interconnection region I1, and a thickness of the first interconnection pattern 31b is greater than that of the fuse pattern 31a. Each of the first interconnection patterns 31b may include a second conductive pattern 24b, a lower interface pattern 25b, and a capping pattern 30b, which are sequentially stacked. The second conductive pattern 24b may include a second barrier pattern 20b and a second conductive pattern 23b, which are sequentially stacked. The capping pattern 30b may include a lower capping pattern 26b and a second upper capping pattern 27b, which are sequentially stacked. The second upper capping pattern 27b may be omitted.

The first conductive pattern 24a' has a thickness thinner than that of the second conductive pattern 24b. The first conductive pattern 23a' and the second conductive pattern 23b may be the same material layer. The first conductive pattern 23a' and the second conductive pattern 23b may be at least one material layer selected from the group consisting of an aluminum layer, a tungsten layer, and a copper layer and combinations thereof. The first and second upper capping patterns 27a and 27b may have a same thickness and may be a same material layer. The lower capping pattern 26b may be the same material layer as that of the second upper capping pattern 27b. The capping patterns 26b, 27a, and 27b may be a titanium nitride layer. The capping patterns 26b, 27a, and 27b may be an anti-reflective layer. The lower interface pattern 25b may be a titanium layer. The first and second barrier patterns 20a and 20b may be the same material layer, and may have the same thickness. The barrier patterns 20a and 20b may be a titanium nitride layer, or may be a composite layer including a titanium layer and a titanium nitride layer, which are sequentially stacked. The barrier patterns 20a and 20b may be omitted.

Since the first conductive pattern 23a' has a thickness thinner than that of the second conductive pattern 23b, the fuse pattern 31a has a thickness thinner than that of the first interconnection pattern 31b. Each of the fuse patterns 31a may have a substantially flat upper surface. The flatness may be a result of the photolithography process and an etch process. Furthermore, the fuse patterns 31a may substantially have a uniform thickness within a wafer. Therefore, an error rate in a fuse blowing operation can be reduced.

Alternatively, as illustrated in FIG. 4C, fuse patterns 31a' may be disposed inside the fuse region F1, and each of the fuse patterns 31a' may include a first conductive pattern 24a', a first upper interface pattern 28a, and a first upper capping pattern 29a, which are sequentially stacked. The first conductive pattern 24a' may include a first barrier pattern 20a and a first conductive pattern 23a', which are sequentially stacked. The fuse pattern 31a' may have a thickness of about 3000 Å or less. Furthermore, first interconnection patterns 31b' may be disposed inside the interconnection region I1, and each of the first interconnection patterns 31b' may include a second conductive pattern 24b, a second upper interface pattern 28b, and a second upper capping pattern 29b, which are sequentially stacked. The second conductive pattern 24b may include a second barrier pattern 20b and a second conductive pattern 23b, which are sequentially stacked. The first conductive pattern 24a' has a thickness thinner than that of the second conductive pattern 24b. The fuse pattern 31a' has a thickness thinner than that of the first interconnection pattern 31b'. The first and second upper capping patterns 29a and 29b may be an anti-reflective layer.

Referring again to FIG. 3F, a second interlayer insulating layer 33 is disposed on the substrate having the fuse patterns 31a and the first interconnection patterns 31b. The second interlayer insulating layer 33 may be a material layer selected from the group consisting of a tetra ethyl ortho silicate (TEOS) layer, a flowable oxide (FOX) layer, a plasma enhanced-TEOS (PE-TEOS) layer, a boron phosphorous silicate glass (BPSG) layer, and combinations thereof. For example, the second interlayer insulating layer 33 may be a TEOS layer, a FOX layer, and a TEOS layer, which are sequentially stacked. Since a portion between the patterns 31a and 31b is filled with the FOX layer, the second interlayer insulating layer 33 may have a flat upper surface.

Via holes 34h may be disposed penetrating the second interlayer insulating layer 33 inside the interconnection region I1 and exposing predetermined portions of the first interconnection patterns 31b. Via contact plugs 34 may fill the via holes 34h. The via hole 34h may expose the inside of the capping pattern 30b, or may penetrate the capping pattern 30b so as to expose the lower interface pattern 25b.

Second interconnection patterns 40 may be disposed on the second interlayer insulating layer 33 inside the interconnection region I1. The second interconnection pattern 40 may include an upper barrier pattern 35, an upper conductive pattern 37, and an upper capping pattern 39, which are sequentially stacked. Each of the second interconnection patterns 40 may be electrically connected to each of the first interconnection patterns 31b through each of the via contact plugs 34. A pad 40p is disposed on the second interlayer insulating layer 33 inside the pad region P1. The pad 40p may include a pad conductive pattern 38p and a pad capping pattern 39p, which are sequentially stacked, and the pad conductive pattern 38p may include a pad barrier pattern 35p and a pad conductive pattern 37p, which are sequentially stacked.

A passivation layer 43 may be disposed on the substrate having the second interconnection patterns 40 and the pad 40p. The passivation layer 43 may be a composite layer including a plasma oxide layer 41 and a plasma nitride layer 42, which are sequentially stacked. A polyimide pattern 50 may be disposed on the substrate having the passivation layer 43, and the polyimide pattern 50 has a fuse window opening 50f and a pad window opening 50p exposing a predetermined portion of the fuse region F1 and a predetermined portion of the pad region P1 respectively.

A fuse window 53f is disposed penetrating the passivation layer 43 below the fuse window opening 50f inside the fuse region F1, and penetrating to a predetermined depth in the second interlayer insulating layer 33 below the passivation layer 43. A thin second interlayer insulating layer 33a covering the fuse patterns 31a is disposed below the fuse window 53f. Since the thin second interlayer insulating layer 33a covering the fuse patterns 31a is an oxide layer, a lower energy is required to blow the fuse patterns 31a than the energy required in the related art, in which a silicon nitride layer is used as a fuse-protecting layer.

A pad window 53p is disposed to penetrate predetermined portions of the passivation layer 43 and the pad capping pattern 39p below the pad window opening 50p inside the pad region P1, and expose the pad conductive pattern 38p.

As described above, according to embodiments, after a conductive layer is formed, a fuse conductive layer having a thickness thinner than that of the conductive layer is formed by partially etching. By patterning the conductive layer and the fuse conductive layer, first interconnection patterns and fuse patterns are concurrently formed respectively. As a result, each of the fuse patterns can have a thickness thinner than that of each of the first interconnection patterns, and can have a flat upper surface since the fuse patterns are formed to be patterned through a photolithography process and an etch process. Furthermore, since the fuse conductive layer having a thickness thinner than that of the conductive layer is formed by partially etching in advance, a thickness uniformity of the fuse patterns over a single wafer can be improved. Therefore, the fuse patterns can be blown using a uniform low energy, and since the fuse patterns are formed thin in thickness, an amount of the residual material of the fuse patterns by the blowing of the fuse patterns can be reduced, thereby reducing a bridge with the adjacent metal fuse.

Furthermore, since a fuse window and a pad window are formed using a polyimide pattern as an etch mask, the number of the photolithography processes used can be shortened to one, reducing production costs.

Although particular embodiments have been described, one of ordinary skill in the art will understand that various changes in form and detail may be made without departing from the spirit and scope of the following claims.

What is claimed is:

1. A method of fabricating a semiconductor device comprising:
   providing a semiconductor substrate having a fuse region and an interconnection region;

forming a conductive layer on the semiconductor substrate;

partially etching the conductive layer inside the fuse region to form a fuse conductive layer having a thickness thinner than a thickness of the conductive layer outside of the fuse region;

patterning the conductive layer and the fuse conductive layer to form a first conductive pattern inside the fuse region and a second conductive pattern inside the interconnection region;

forming an interlayer insulating layer on the semiconductor substrate having the first and second conductive patterns; and forming a pad including a pad conductive pattern and a pad capping pattern, the pad formed on the interlayer insulating layer inside a pad region of the semiconductor substrate.

2. The method according to claim 1, further comprising:

forming a lower capping layer on the conductive layer before partially etching the conductive layer;

wherein:

partially etching the conductive layer inside the fuse region further comprises removing the lower capping layer inside the fuse region; and patterning the conductive layer and the fuse conductive layer further comprises patterning the lower capping layer inside the interconnection region to form a lower capping pattern.

3. The method according to claim 2, further comprising:

forming a lower interface layer on the conductive layer before forming the lower capping layer;

wherein:

partially etching the conductive layer inside the fuse region further comprises removing the lower interface layer inside the fuse region; and patterning the conductive layer and the fuse conductive layer further comprises patterning the lower interface layer inside the interconnection region to form a lower interface pattern.

4. The method according to claim 1, further comprising:

forming an upper capping layer on the conductive layer and the fuse conductive layer after partially etching the conductive layer;

wherein patterning the conductive layer and the fuse conductive layer further comprises patterning the upper capping layer to form a first upper capping pattern on the first conductive pattern and a second upper capping pattern on the second conductive pattern.

5. The method according to claim 4, wherein the upper capping layer is formed of a titanium nitride (TiN) layer.

6. The method according to claim 4, wherein the upper capping layer is an anti-reflective layer.

7. The method according to claim 4, further comprising:

forming an upper interface layer on the substrate having the fuse conductive layer before forming the upper capping layer;

wherein patterning the conductive layer and the fuse conductive layer further comprises patterning the upper interface layer to form a first upper interface pattern on the first conductive pattern and a second upper interface pattern on the second conductive pattern.

8. The method according to claim 1, wherein the conductive layer further comprises at least one of a metal layer and a barrier layer.

9. The method according to claim 8, wherein the metal layer further comprises one material layer selected from the group consisting of an aluminum layer, a tungsten layer, a copper layer, and combinations thereof.

10. The method according to claim 1, further comprising:

forming a passivation layer on the semiconductor substrate having the pad; and etching the passivation layer, the pad capping pattern, and the interlayer insulating layer to form a fuse window inside the fuse region such that a predetermined thickness of the interlayer insulating layer remains on the first conductive pattern, and to form a pad window exposing the pad conductive pattern of the pad.

11. The method according to claim 10, wherein etching the passivation layer, the pad capping pattern, and the interlayer insulating layer further comprises:

forming a polyimide layer on the passivation layer;

performing a exposure process and a developing process on the polyimide layer to form a polyimide pattern having openings exposing a predetermined portion of the fuse region and a predetermined portion of the pad region; and etching the passivation layer, the pad capping pattern, and the interlayer insulating layer, using the polyimide pattern as an etch mask.

12. The method according to claim 10, wherein etching the passivation layer, the pad capping pattern, and the interlayer insulating layer further comprises:

etching the passivation layer to expose the interlayer insulating layer in the fuse region, and the pad capping pattern of the pad region;

etching the exposed pad capping pattern to expose the pad conductive pattern of the pad region; and partially etching the exposed interlayer insulating layer of the fuse region without etching the first conductive pattern.

13. The method according to claim 1, wherein the interlayer insulating layer further comprises one material layer selected from the group consisting of a tetra ethyl ortho silicate (TEOS) layer, a flowable oxide (FOX) layer, a plasma-enhanced TEOS (PETEOS) layer, a boron phosphorous silicate glass (BPSG) layer, and combinations thereof.

* * * * *